United States Patent [19]

Adachi

[11] Patent Number: 5,373,395
[45] Date of Patent: Dec. 13, 1994

[54] OPTICAL SYSTEM TO OBTAIN UNIFORM ILLUMINATION FROM DIODE LASER

[76] Inventor: Yoshi Adachi, 16214 Watson Cir., Westminster, Calif. 92683

[21] Appl. No.: 58,205

[22] Filed: May 10, 1993

[51] Int. Cl.$^5$ .................. G02B 13/10; G02B 13/12
[52] U.S. Cl. .................. 359/652; 359/669; 359/670
[58] Field of Search .................. 359/652-655, 359/668-671

[56] References Cited

U.S. PATENT DOCUMENTS 4,900,138 2/1990 Atkinson, III et al. .......... 359/669

Primary Examiner—Scott J. Sugarman
Attorney, Agent, or Firm—James T. English

[57] ABSTRACT

The diode laser having an elliptic beam and a Gaussian intensity distribution is transformed by graded index lenses and beam shaping prisms to a circular beam of small diameter and then focused to a point. The focused beam is then magnified by a compound meniscus lens and a collimating lens, producing a collimated flat beam of uniform intensity having negligible loss of the energy of the diode laser radiation. The design is easily implementable using all spherical surface lenses and industry standard glass types, producing a collimated, diffraction limited output beam.

9 Claims, 4 Drawing Sheets

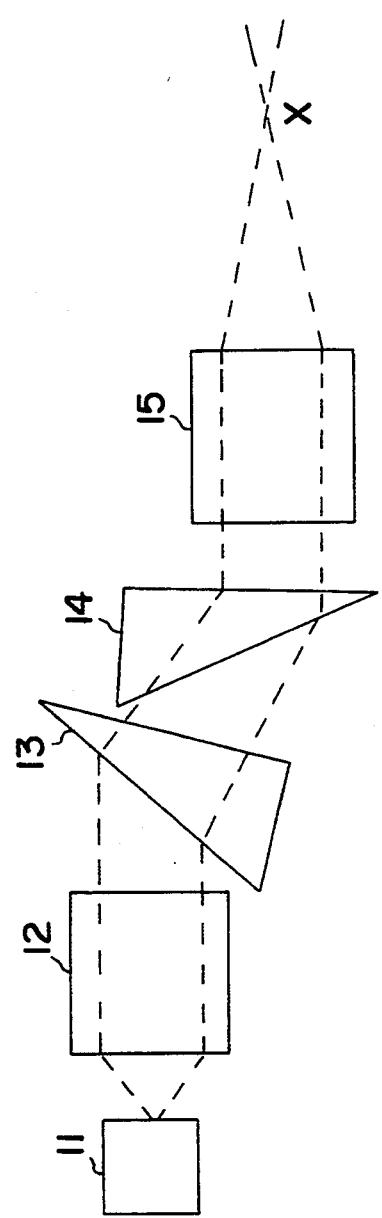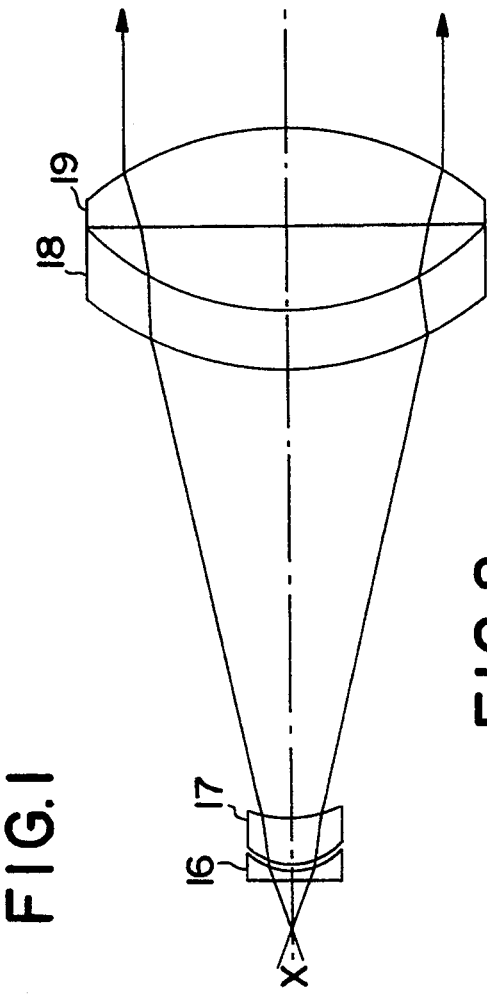

OPTICAL SYSTEM TO OBTAIN UNIFORM ILLUMINATION FROM DIODE LASER

BACKGROUND OF THE INVENTION

1. Field of the Invention

This invention relates to diode lasers and more particularly to diode laser illumination devices having a flat uniform intensity distribution in lieu of Gaussian intensity distribution. The laser devices consist of a solid state laser diode in combination with optical elements for collimating, shaping and focusing the beam. These optical elements include the compound lenses, graded index lenses, prisms or other elements in accordance with the specific application of the laser.

2. Description of the Prior Art

Diode lasers emit a diverging beam of light having a Gaussian distribution. For spatial light modulation applications, there is a need for uniform distribution rather than Gaussian. To fulfill the requirements, an aspheric or a holographic pair of lenses is needed; but, they are very expensive or subject to effects of humidity and pressure. See "Applied Optics" published data:

- Vol. 22 p 3644, 1983 Chang-Yuan et al: "Reshaping Collimated Laser Beam with Gaussian Profile to Uniform Profile Using Holography".
- Vol 19 p. 3545, 1980 P. W. Rhode et al: "Refractive Optical System for Irradiance Redistribution of Collimated Radiation Using Aspherical Elements"

A beam from a Gas laser, He—Ne or $CO_2$ was discussed in

- "Optics and Laser Technology" Vol. 14, Pg 159; 1982, D. Shafer; and
- U.S. Pat. No. 3,476,436 describes a spherical lens pair and mentioned four spherical elements as a possibility for changing the intensity distribution. Also, in the prior art, the diode laser beam, being divergent about 20 degrees perpendicular to the junction and 10 degrees parallel to the junction, is reshaped to a circular beam using 2 prisms by a method described in U.S. Pat. 4,609,258 to Adachi et. al.

SUMMARY OF THE INVENTION

In accordance with the invention, the Gaussian beam emitted by the laser diode and shaping optics is made flat by means of spherical surface lens elements in two groups: (1) The first group lens spreads the center of the beam at a wider angle and a lesser angle toward the edge, (2) the second group is a collimation lens which corrects wavefront aberration, and emits a perfectly collimated beam.

A convex surface in group 1 faced to the expanding beam has a steep curvature which generates a strong spherical aberration but corrects the Gaussian distribution to flat illumination. The group 2 lens compensates the spherical aberration then emits a perfectly collimated and uniform intensity beam. All elements are spherical surface, easy to make, and highly efficient.

BRIEF DESCRIPTION OF THE FIGURES

FIG. 1 is a drawing of a beam lens system to obtain the circular distribution, and shows a graph of the Far Field Pattern of a typical diode laser as well as the round, Gaussian output.

FIG. 2 is a drawing of the beam shaping to circular intensity distribution system

DETAILED DESCRIPTION OF THE INVENTION

Figure 3:
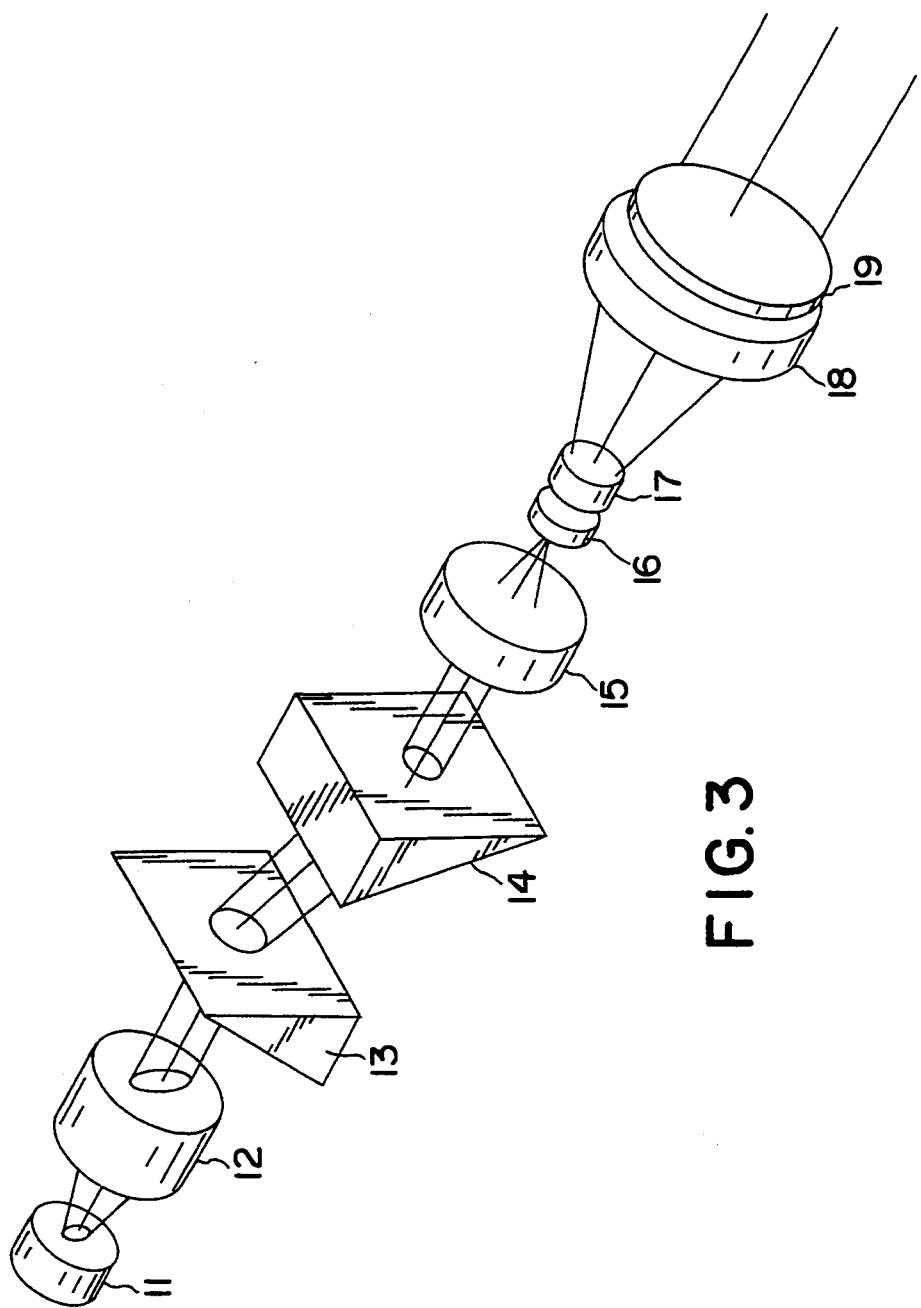
FIG. 3 is an isometric drawing of the combination of the beam shaping and Gaussian correction optics.

A typical diode laser's light emitting characteristic is shown in FIG. 1. The emitting diode 11 wavelength is 670 nm, the beam divergence is 20 degrees perpendicular to the junction and 10 degrees parallel to the junction. At 0.4 intensity they are 10 and 5 degrees respectively and the inside of this beam is used to obtain flat illumination. The outside of the beam is masked out. The beam is then collimated with a small lens 12, numerical aperture NA=0.2. A graded index rod lens with 3 mm diameter or a Selfoc lens may be used. The graded index rod lens is a cylindrical lens having flat surfaces on both ends, and a parabolic graded index of refraction formed by a process of ion implantation. The collimated beam enters the beam shaper, made up of prisms 13, 14. The second graded index lens 15 converges the round beam from the beam shaper to a point X from which it diverges and is expanded in the Gaussian beam corrector. The corrector consists of two lens groups. The first group 16, 17, FIG. 2, expands the 10 degree beam to 20 degrees and beam shapes to flat illumination at the second group 18, 19. The second group lens compensates the aberration introduced by beam shaping and emits a perfectly collimated beam as shown in FIG. 3.

Figure 4:
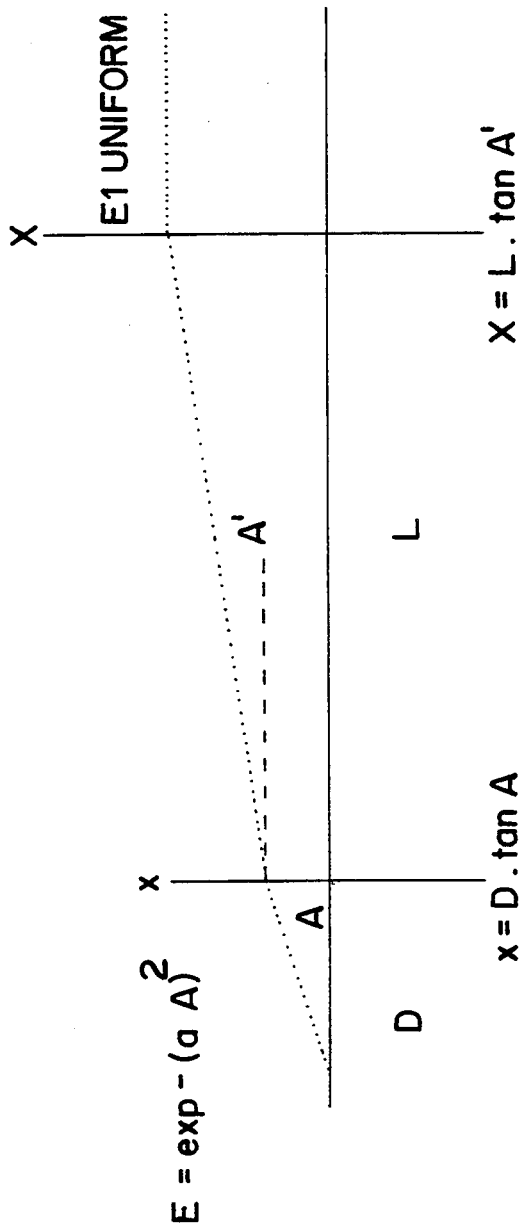
FIG. 4 is a geometrical diagram of a beam propagation to obtain flat illumination.

In FIG. 4, the intensity distribution at the Gaussian beam shaper is x = (tan A) E
A = diverging angle
E = exp−(a A)$^2$ Gaussian distribution The intensity distribution at collimating lens is:

X = (tan A)' L E1
L is the distance between two groups.
E1 should be uniform at the surface.
Flat distribution.
Because $x^2 E = X^2 E1$
We obtain Table 1

TABLE 1

Incident angle to Exit height Relation to get Uniform Intensity.

| A | E | X |
|---|---|---|
| 0 | 1.0 | 0 |
| 5 | .925 | 3.65 |
| 10 | .8 | 6.85 |
| 15 | .6 | 9.07 |
| 20 | .4 | 10 |

Figure 5:
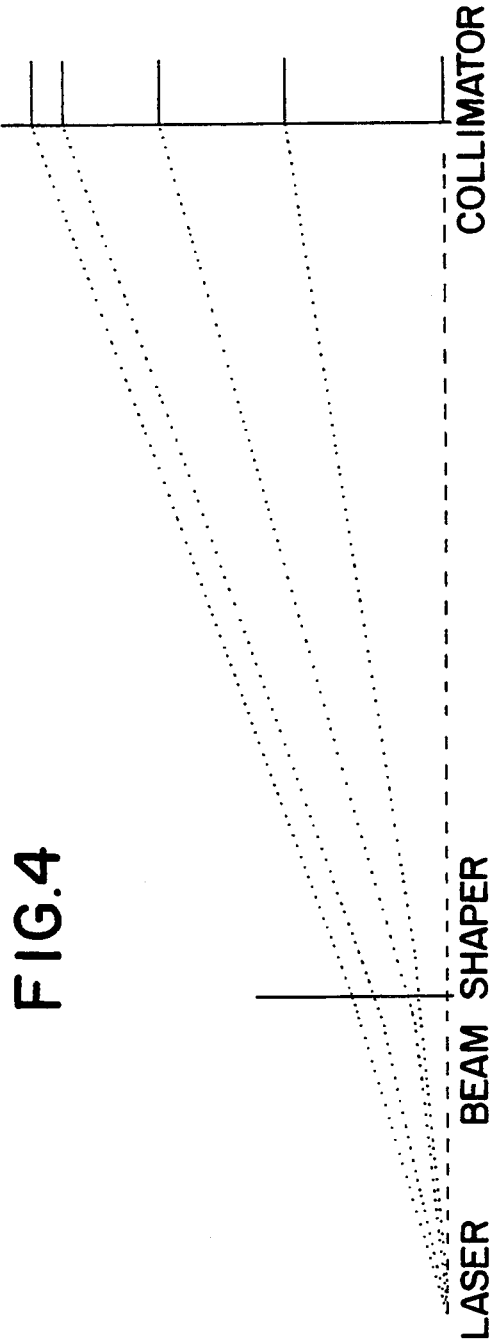
FIG. 5 is a schematic diagram of the beam propagation and correction from Gaussian to flat distribution.

The results of the scheme of beam expansions is shown in FIG. 5. The beam diverges more in the center, less near the edge, to obtain the flat illumination.

Figure 6:
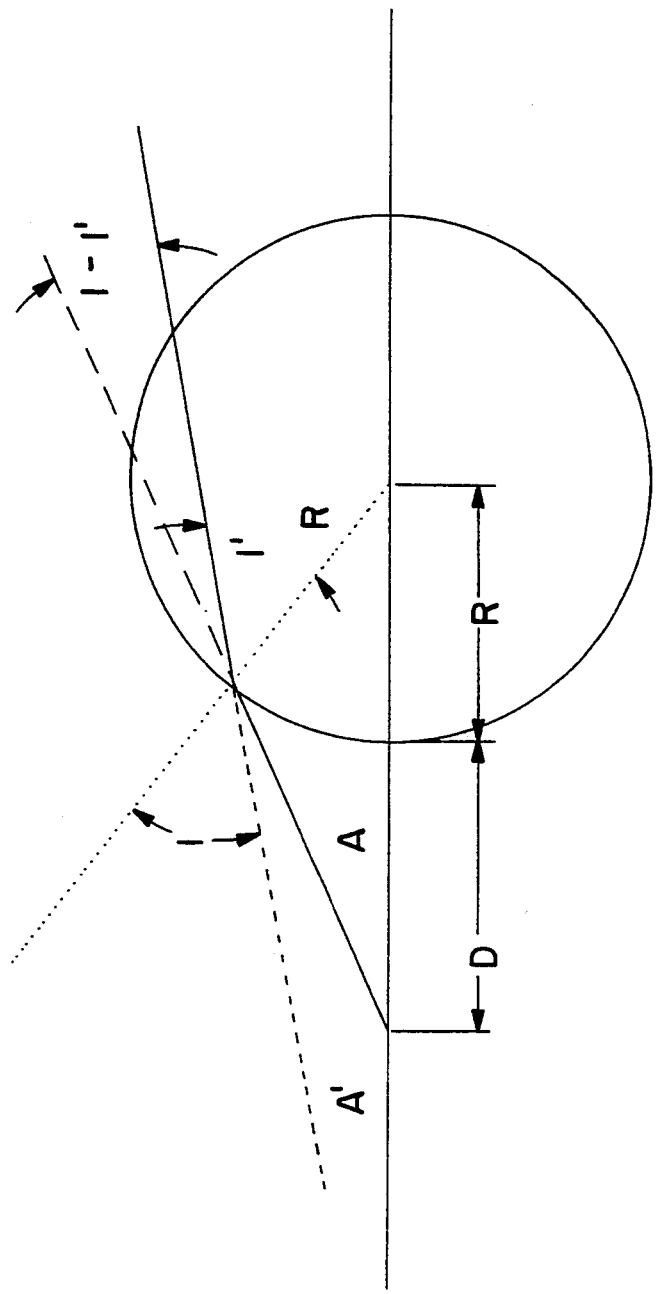
FIG. 6 is a diagram of surface refraction of the beam shaping surface.

The Gaussian to flat beam shaping mechanism is in the second lens in Group 1. The divergent beam enters the convex surface as shown in FIG. 6.

The refraction takes place in the following equation:

$$\sin I = \frac{D + R1}{R1} \sin A, \quad \sin I = N \sin I'$$

$A' = A - (I' - I)$
For $D=4$, $R1=4$
An example is shown in Table 2

TABLE 2

| Example of Refraction for Gaussian beam shape | | | |
|---|---|---|---|
| A | I | I'-I | A' |
| 5 | 10.038 | 3.427 | 1.573 |
| 10 | 20.320 | 7.060 | 2.939 |
| 15 | 31.174 | 11.181 | 3.818 |
| 20 | 43.16 | 16.360 | 3.700 |
| N = 1.514 (BK7) | | | |

When ray traced to the objective lens, the height is compared to theoretical results as shown in Table 3 where $R2=7$, $D2=3$, $L=26$.

TABLE 3

| COMPARISON OF THEORETICAL AND DESIGNED HEIGHT | | |
|---|---|---|
| A | RAY TRACED HEIGHT | THEORETICAL HEIGHT |
| 5 | 3.1 | 3.65 |
| 10 | 6.0 | 6.85 |
| 15 | 8.5 | 9.07 |
| 20 | 10 | 10 |

This correction is not perfect, yet brighter in the central area. Using a shorter radius it is possible to get even brighter at the edge. The longer radius has better wide field, offense from the sine condition, the wave front aberration is better, and alignment is easier. As shown, the total design in Table 4, repeated use of the same radius of curvature and very popular glass (BK7) keeps production cost down. The size is very compact 50 mm length, 30 mm width. The Group 2 lenses include objective lens 19 and a meniscus lens 18 to compensate the aberration caused by the beam shaper.

An example is shown in Table 4.

The elliptical beam from the diode laser is shaped to circular distribution by beam shaper prisms 13, 14 shown in FIG. 1. The beam is converged by lens 15 (Selfoc). The converged point is now the starting point of Gaussian beam corrector as shown in FIG. 2.

In the following Table 4, the radii of curvature R1 through R8 refer to the front and back surface curvatures of the optical elements 16, 17, 18 and 19, the distances D1 through D7 refer to distances between the elements, and the index of refraction is given except where an air gap occurs.

TABLE 4

| Example of Gaussian Beam Shaper | | |
|---|---|---|
| Radius of Lens Curvature mm | Distance mm Between Elements | Refraction Index |
| | Diode d0 = 6.1 | |
| R1 = flat | | |
| | d1 = 2.0 | N = 1.514 |
| R2 = 4.0 | | |
| | d2 = 1 | AIR |
| R3 = 4.0 | | |
| | d3 = 3.0 | N = 1.514 |
| R4 = 7 | | |
| | d4 = 26.0 | AIR |
| R5 = 19.64 | | |
| | d5 = 4.0 | N = 1.514 |
| R6 = 17.3 | | |
| | d6 = 3.67 | AIR |
| R7 = flat | | |
| | d7 = 7.64 | N = 1.514 |
| R8 = −19.69 | | |

Focal length = 67 mm, F/3.35 for wavelength 670 nm

The wave front aberration is 1/6 P-V 1/30 wave of RMS. Glasses are all BK7, the industry standard for good transmission and high resistance to climatic effects.

Hereinbefore have been described the preferred embodiments of the invention and when it becomes known, it is expected that modifications, equivalents, and other modes of operation of the invention will occur to those skilled in the art without departing from the essence and teachings of the invention; it is therefore intended that the claims be interpreted as having these equivalents incorporated therein.

What is claimed is:

1. The method for modifying laser output beam intensity from Gaussian elliptical distribution to circular, flat, uniform intensity distribution, using spherical optical elements, which comprises the steps of:

focusing the beam to assure 20 degree divergence using a graded index of refraction lens collimating the beam;

shaping the beam using a prismatic beam shaper receiving the collimated beam from said graded index lens, producing a round beam from the beam;

converging the round beam using a second graded index lens, focusing the beam to a point and then diverging the beam;

correcting the beam from Gaussian to uniform, using a compound lens including a meniscus lens receiving the divergent beam from said second graded index lens, and expanding the beam;

reducing spherical aberration and collimating the beam using a second compound lens, including a meniscus lens and an objective lens, receiving the expanded beam from said first compound lens.

2. In a junction diode laser and optical system having an emitting wavelength in the nanometer range and an elliptical shaped beam, the beam divergence being about 20 degrees perpendicular to the junction and 10 degrees parallel to the junction, and having Gaussian intensity distribution; the improvement for correcting the Gaussian beam intensity distribution to flat distribution, using all spherical lens elements, which comprises:

a first graded index of refraction lens collimating the diode beam;

a beam shaper receiving the collimated beam from said graded index rod lens, producing a round beam from the elliptical diode beam;

a second graded index of refraction lens receiving the round beam from said beam shaper and producing a beam focused to a convergence point;

a Gaussian beam corrector and collimator consisting of:

a compound lens including a meniscus lens receiving the beam from said second graded index rod lens from the convergence point and expanding the beam;

a second compound lens, including a meniscus lens and an objective lens, receiving the expanded beam from said first compound lens;

whereby the converged beam compensates aberration introduced by beam shaping, the first compound lens expands the beam and the second compound lens emits an expanded, collimated beam having uniform intensity distribution.

3. The improvement in a junction diode laser as described in claim 2, wherein the elliptical to circular beam shaper consists of:

a graded index lens passing and collimating the elliptical beam having an ellipse major axis and a minor axis;

a prism receiving the collimated elliptical beam major axis along the hypotenuse of said prism, and producing a circular beam.

4. The improvement in a junction diode laser as described in claim 2, wherein the Gaussian beam corrector and collimator consisting of:

a compound lens including a meniscus lens receiving the beam from a 20 degree divergent source and having a meniscus radius of 3 to 5 mm, for expanding the beam; and a second compound lens including a meniscus and an objective lens receiving the expanded beam from said compound lens and emitting an expanded, collimated beam having uniform intensity distribution;

whereby any source having a 20 degree divergent Gaussian distributed intensity beam is converted to a collimated, uniform intensity beam.

5. The improvement in a junction diode laser as described in claim 2, wherein the first graded index of refraction lens collimating the diode beam is focused to a plane 0.4 to 0.6 of the maximum beam intensity, wherein the Gaussian beam is near uniform.

6. The improvement in a junction diode laser as described in claim 2, wherein the first graded index of refraction lens collimating the diode beam is focused at the diode junction.

7. The improvement in a junction diode laser as described in claim 2, wherein the beam corrector first compound lens meniscus has a radius 3 to 5 millimeters, and the angle of divergence of the laser beam is 20 degrees from axial and at a focal point distance of 5 to 7 mm from the meniscus surface.

8. The improvement in a junction diode laser as described in claim 2, in combination with a light modulator located in light communication with the objective lens, whereby the laser frequency is modulated and heterodyned by a local oscillator frequency.

9. The improvement in a junction diode laser as described in claim 2, further comprising electrical modulator means for electrically modulating the laser diode at frequencies including the range from DC to Gigahertz.

* * * * *